United States Patent [19]

Cech

[11] Patent Number: 5,282,364
[45] Date of Patent: Feb. 1, 1994

[54] DEVICE IN THE THERMOELECTRIC HEATERS/COOLERS

[76] Inventor: Pavel Cech, S-443 39 Lerum, Odenius väg 13, Sweden

[21] Appl. No.: 915,843
[22] PCT Filed: Jan. 18, 1991
[86] PCT No.: PCT/SE91/00035
§ 371 Date: Jul. 23, 1992
§ 102(e) Date: Jul. 23, 1992
[87] PCT Pub. No.: WO91/11666
PCT Pub. Date: Aug. 8, 1991

[30] Foreign Application Priority Data

Jan. 24, 1990 [SE] Sweden .................. 9000241

[51] Int. Cl.$^5$ .................................................. F25B 21/02
[52] U.S. Cl. .................................... 62/3.2; 165/80.3; 62/3.3
[58] Field of Search ................... 62/3.2, 3.3, 3.4, 3.5, 62/3.6, 3.61, 3.62, 3.63, 3.64; 165/80.3

[56] References Cited

U.S. PATENT DOCUMENTS 3,220,471 11/1965 Coe .................................. 165/80.3
4,007,600 2/1977 Simms ................................ 62/3.2
4,472,945 9/1984 Cech et al. ........................ 62/3.3
4,759,190 7/1988 Trachtenberg .................. 62/3.62

FOREIGN PATENT DOCUMENTS

A202342166 11/1989 European Pat. Off. .
A12626978 1/1977 Fed. Rep. of Germany .
444977 5/1986 Sweden .
452648 12/1987 Sweden .

*Primary Examiner*—John M. Sollecito
*Attorney, Agent, or Firm*—Dvorak and Traub

[57] ABSTRACT

The invention concerns thermoelectric coolers/heaters of the kind comprising at least one thermoelectric block and heat-exchanging means consisting, at least on one side of the block, of metallic convector elements over which sweeps a fan-generated current of forced air. In accordance with the invention the convector element is formed by squarely cut, extruded profile members having longitudinally extending portions forming fins and channels. The fan is an axial fan the impeller (22) of which spans most of the cross-sectional area of the convector element (7), and the convector profile member has means (9; 23) to secure the fan unit in position.

20 Claims, 7 Drawing Sheets

DEVICE IN THE THERMOELECTRIC HEATERS/COOLERS

The subject invention concerns a device in thermoelectric coolers, primarily of the kind comprising at least one thermoelectric block, usually of the Peltier type, and heat exchanging means which at least at one side of the block consist of metallic convector elements over which sweep a current of forced air provided by a fan.

Devices of this kind are known, for instance from U.S. Pat. No. 4,472,945. However, in accordance with this prior-art construction the current of forced air generated by a fan is initially made to enter in a direction at right angles to the heat-absorbing/dissipating surface of the thermal element and is then deflected to assume a direction in parallel with said surface. As a result, in this prior device comparatively large heat-absorbing/dissipating surfaces in facing relationship will exist externally of the thermal element as seen alongside its planes, and consequently comparatively large heat losses occur, unless some particularly efficient insulation is positioned in the gap between these surfaces not occupied by the thermoelectric element. In addition, the convector part over which the air current sweeps is comparatively complex because large recesses must be lathed or cut therein in order to accommodate certain equipment, such as the fan motor and the fan impeller.

The main purpose of the invention is to eliminate these disadvantages and to provide a device of considerably simplified structure wherein additionally the heat leakage from the hot to the cold side is small while at the same time the device is comparatively compact and requires but little space in relation to its intended cooling and heating capacity. This capacity may be increased, e.g. by increasing the number of thermoelectric blocks used in the device.

This purpose is achieved in a device in accordance with the invention which is essentially characterized in that the convector element is formed by squarely cut, extruded profile members having portions extending longitudinally, i.e. alongside the thermoelectric blocks so as to form respectively fins and channels, and in that said fan is an axial fan having an impeller spanning the major portion of the convector element cross-sectional area, said convector profile member being provided with means to retain the fan unit in position.

Preferably, the profile member forming the convector element is housed in a space delimiting a tunnel which, in addition to housing the convector element, also accommodates the fan unit. In this manner a rectilinear current of air is provided which very efficiently sweeps over the surfaces of the convector profile member and provides efficient heat transfer while at the same time the heat losses between the cold and hot sides of the device are reduced to a minimum on account of the reduced necessity of extension externally of the heat-conducting surfaces of the thermoelectric block.

Preferably, the profile member forming the convector element has at least one longitudinal channel housing the associated control and/or drive units. This reduces the external dimensions of the device to a minimum while at the same time the various units are well protected against unintentional manipulation.

In accordance with one preferred embodiment the fan may have a motor body which projects axially from the fan impeller unit and which is supported in and is retained by said channel formed in the convector profile member. This arrangement reduces the mounting equipment to a minimum while at the same time provides a well integrated unit without unnecessary mounting components.

Preferably, the fan may furthermore be a module having a cross-sectional extension equalling the corresponding extension of the profile member forming said convector element. Owing to this arrangement the convector element and the fan unit fit perfectly into the channelling system in which these units are positioned.

Preferably, the fan module as well as the convector profile member has a cross-sectional extension equalling the internal cross-sectional extension of the tunnel.

Furthermore, it is preferable that the oppositely directed planar faces of the thermoelectric block which are made from a heat conducting material are positioned so as to have extensive heat-transfer contact with the corresponding planar faces of the associated convector profile members, said associated convector profiles extending in mutual parallel relationship. This arrangement largely contributes to the space-saving structure of the device and to efficient utilization of the energy supplied.

Preferably, a thermally insulating material surrounding the thermoelectric block bridges the gap between the oppositely directed, planar convector profile member faces on either side of the thermal block, which faces have an extension exceeding that of the thermal block. This arrangement results in efficient insulation against the space to be heated/cooled.

Preferably, the convector profile member is formed with lengthwise grooves by means of which equipment, such as said fan and other equipment mounted in abutment against the ends of the profile member, may be screwed onto the profile member.

This minimizes the number of mounting components that is required.

Furthermore, the convector profile member is accommodated in a housing having an internal square cross-sectional configuration, essentially corresponding to the external cross-sectional extension of the convector profile member, whereby a number of discrete lengthwise channels are formed in the internal space of the housing.

When one wishes to increase the heating/cooling capacity of the device two or several thermoelectrical blocks may be placed in spaced relationship in a row alongside the convector profile member, the gaps between said blocks being filled with a heat insulating material.

The invention will be described in the following in more detail with reference to the accompanying drawings, wherein.

Figure 7:
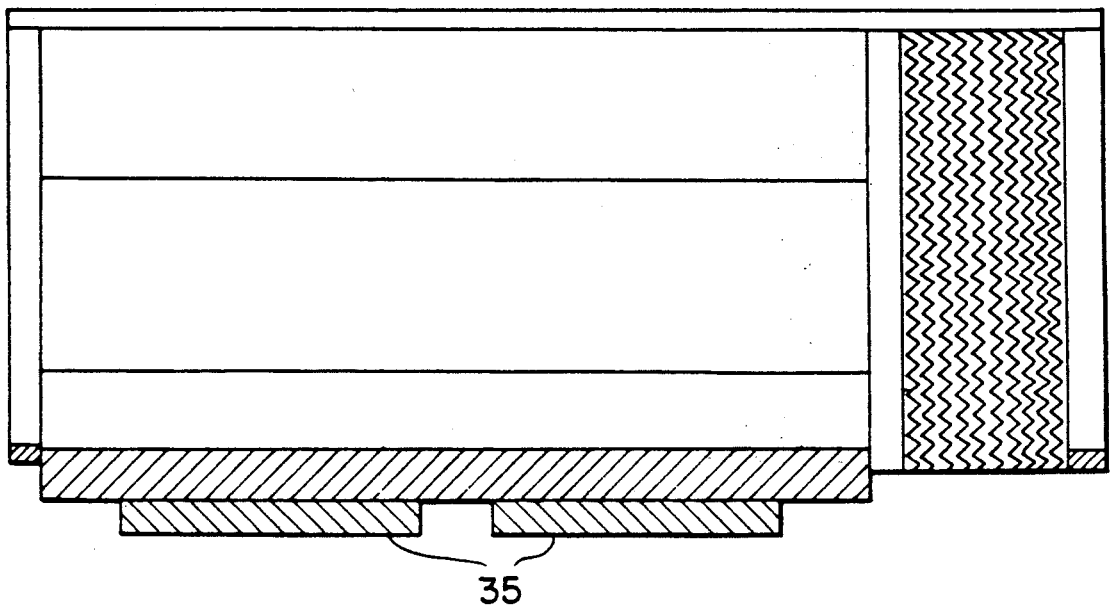
FIG. 7 is a highly schematical view in cross-section through a part of the device in accordance with the invention.
Figure 8:
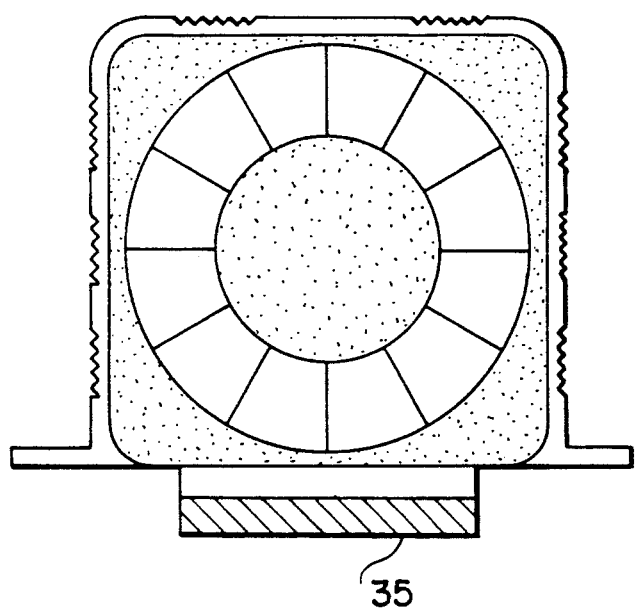
Figure 9:
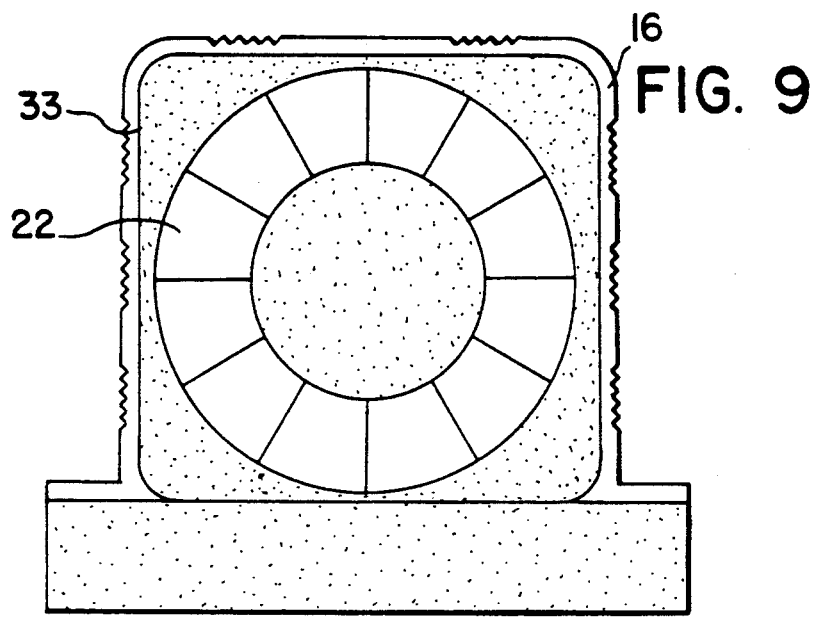
Figure 10:
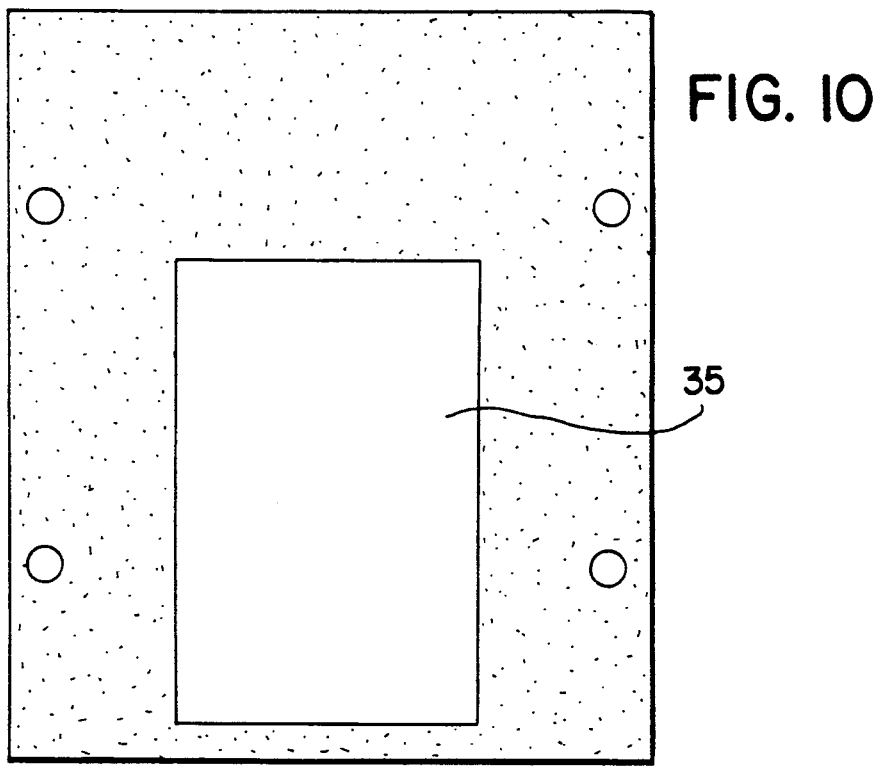

FIG. 8 a likewise highly schematical end view of the same part as that shown in FIG. 7;

FIG. 9 is an end view corresponding to FIG. 8 and shows the same device for transfer of heat between air and another medium, such as a liquid;

FIG. 10 is a view from below of the device of FIG. 9; and

Figure 11:
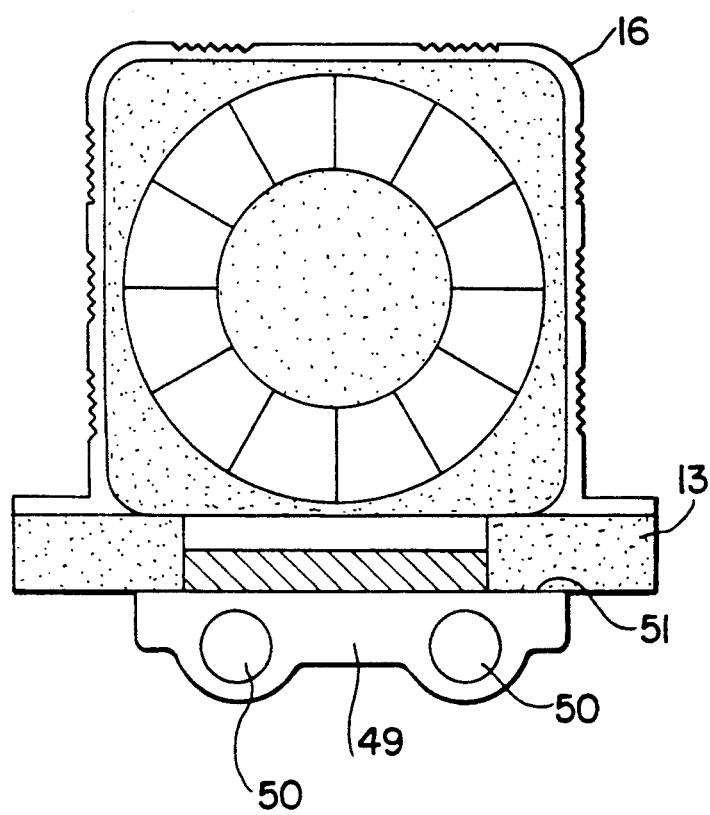

FIG. 11 is a view corresponding to FIG. 9 but also illustrating a heat transfer element for liquid.

Figure 1:
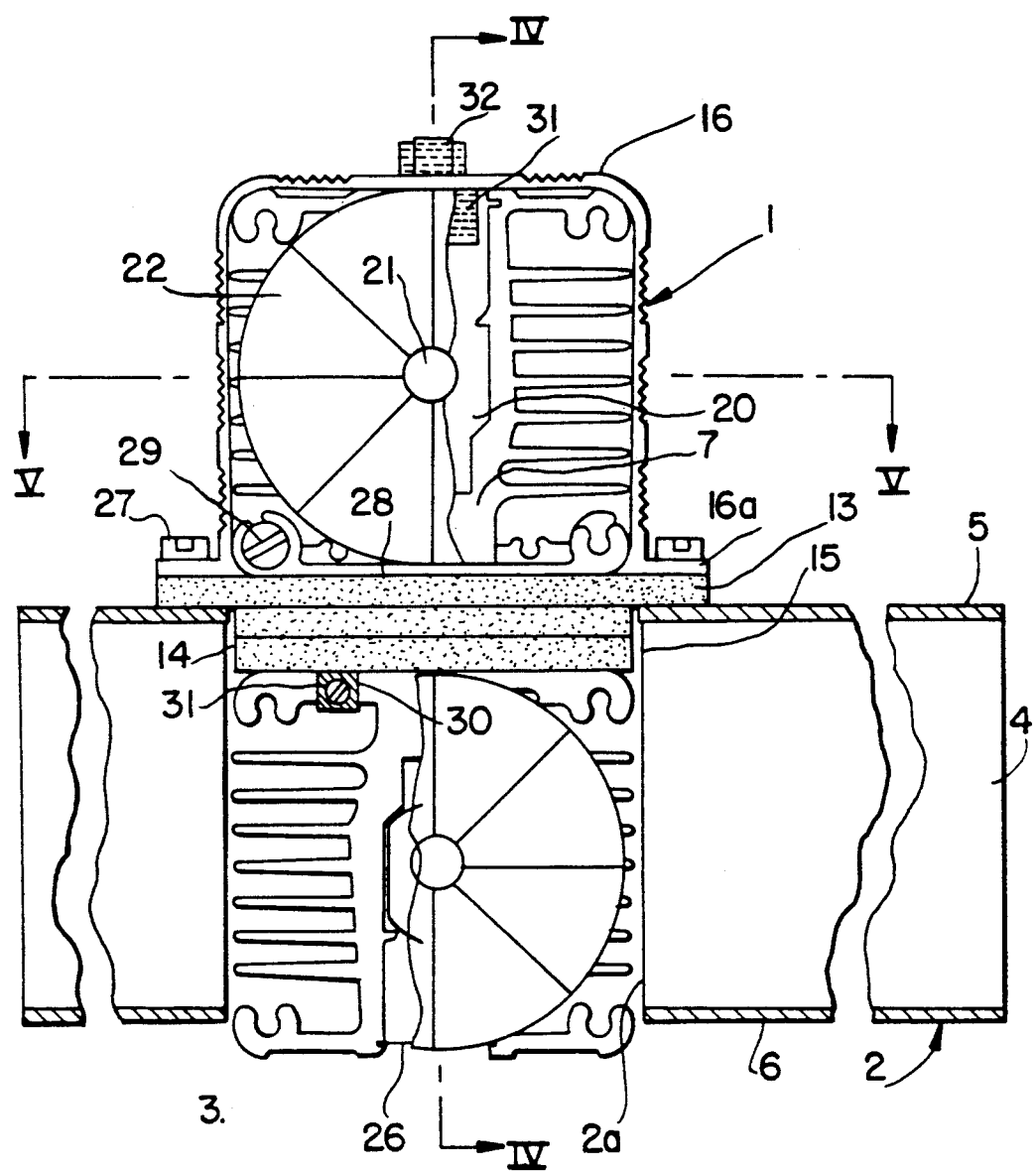
FIG. 1 is a partly cut end view of a cooling/heating device in accordance with the invention shown when mounted in the wall of a space to be cooled/heated.

In FIG. 1 is shown one embodiment of the invention, wherein by numeral 1 is designated generally a cooling device mounted in the wall 2 of the space to be cooled, alternatively heated.

In the embodiment illustrated, the wall 2 consists of an insulating layer 4 which is covered on either side by a rigid surface layer 5 and 6 respectively, which latter layers may be made from a plastic, sheet metal or other structural material. The wall 2 could for instance be the wall of a conventional refrigerator box but the device is useful within a large range of areas where temperature control is desired, in a reduced space. More precisely, it has been found that economic temperature control may be achieved by means of the invention in reduced-volume areas.

Figure 2:
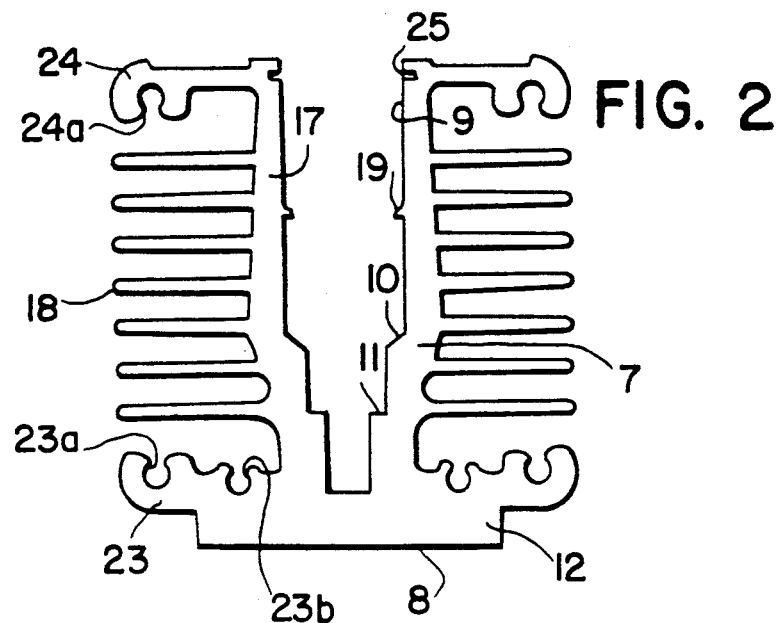
FIG. 2 is an end view of a profile member forming a convector element incorporated in the device.

The device 1 illustrated in FIG. 1 consists of two profile members 7 which are pressed against one another and the cross-sectional shape of which is most clearly shown in FIG. 2. On one of its sides, these profile members are formed with a planar surface 8. Intermediate the planar surfaces 8 of the two profile members 7 is positioned one or several thermoelectric elements, preferably of Peltier type. As a rule, these elements have a square or rectangular configuration. When this is the case, the planar surfaces 8 of the profile members have an extension of corresponding configuration so that the heat exchange surface of the thermoelectric elements are in mating relationship to the planar surfaces 8 of the profile members. The profile members have a deep, centrally located groove 9 which tapers stepwise in a direction towards the planar surface 8 by way of a first stepped shoulder 10 and a second stepped shoulder 11. The stepped shoulder 11 preferably serves as an abutment face against which is supported the head of a bolt screwed into the opposite profile member, thus maintaining the two profile members pressed against each other, squeezing the Peltier element between them. The planar surface 8 is formed on a profile abutment 12. In order to eliminate heat leakages as far as possible the profile abutments of both profile members are surrounded by plates 13 and 14, respectively, of an insulating material whereas the thermoelectric element, not shown in FIG. 1, is surrounded by a insulating plate 15.

In the embodiment shown, the profile member on the external face of the wall 2 is surrounded by a U-shaped housing 16 having an internal cross-sectional shape essentially corresponding to the external cross-sectional shape of the profile member 7. A number of fins 18 project from the side walls 17 of the groove 9, said fins defining, together with the housing 16, a number of channel-like air passages. Spaced from the shoulder 10, preferably rib-like protrusion 19 are provided inside the groove 9.

The profile members 7 are preferably made from an extruded material having good heat conducting properties, such as aluminium. The extruded profile member rod is preferably cut squarely into lengths which are adapted to the existing cooling/heating requirements.

Numeral reference 20 designates a fan motor which is accommodated in the space delimited by the side walls of the groove 9, the shoulders 10 and the protrusions 19. Preferably, this space has a configuration matching that of the motor body and the motor body preferably is constrained in position by means of a spring leaf foil retained in place between the protrusions 19. On the shaft 21 of the motor 20 is mounted a fan impeller unit 22 which is positioned externally of the end of the profile member 7 and preferably covers the larger part of the cross-sectional area of the profile member.

The outer, lateral flanges 23 and 24, respectively, of the profile member is provided with undercut grooves 23a and 24a, respectively, which may be used to secure in position further details, for instance by means of axially extending screws. Additional undercut grooves, such as the groove 23b formed in the fin 23 may be provided, for instance for mounting thereon of further components. In the lateral wall of the groove or channel 9, adjacent its longitudinally extending lateral mouth are provided longitudinal grooves 25 which may serve for attachment of details, such as for instance a covering strip 26 which, as illustrated in FIG. 1, is mounted in the profile member facing the space 3.

The housing 16 which preferably also is made of a material having good heat conducting properties, such as for instance aluminium, is provided at its open side with flanges 16a by means of which the groove is attached to the outer wall layer 5 by means of screws 7 which are screwed into the wall 2. In order to support the outer insulating plate 13 a bridging element 28 is attached by means of screws 29 which are inserted into the screw grooves 23a of the lateral fins 23. Preferably, the housing 16 has a length so as to project axially above the fan impeller 22 and preferably it has the same length as the latter. The bridging member 28 in this case serves to support the insulating plate 13 between the end of the profile member 7 and the end of the housing 16. In this manner, the profile member 7 and the housing 16 form a channeling system in which the air is guided rectilinearly, whereby the air is forced to pass through the profile member by means of the axially positioned fan 22. The profile member 7 which is turned towards the space 3 defines, together with the edge faces 2a opposite the profile member and the covering strip, a channelling system similar to that formed within the housing 16 of the other profile member.

In accordance with the embodiment illustrated, the two insulating plates 14 and 15 are positioned recessed within the outline of the external faces of the wall 2 in an aperture delimited by the edge faces 2a of the wall 2.

By reference numeral 30 is designated a component which by means of a screw 31 may be secured in the undercut groove 23b. This component could for instance be a control electronics, such as a temperature sensing means. Other components incorporated in the control system of the device could, as is indicated by reference 31, be housed in the groove 9 on the inner face of the housing 16. Further details, as indicated by reference 32, could also be arranged on the exterior of the housing, such as manual switches.

Figure 3:
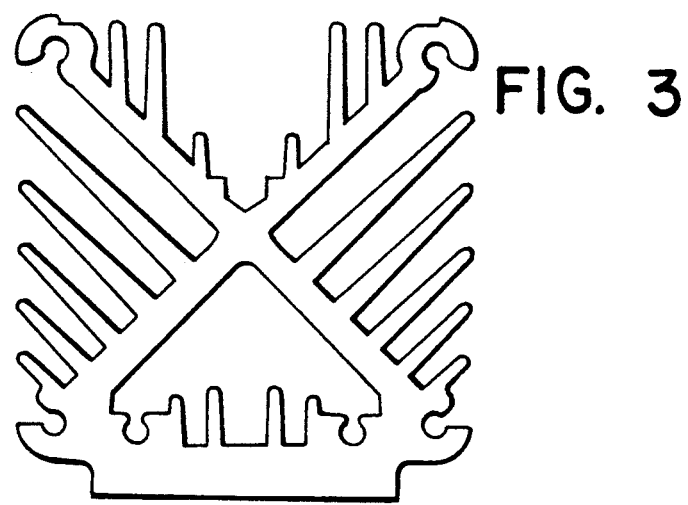
FIG. 3 is an end view of a corresponding convector profile member in accordance with another embodiment.

In the embodiment illustrated in FIG. 1 is used the profile member illustrated in FIG. 2. However, it is quite possible to use profile members of other suitable configurations, such as the one illustrated in FIG. 3. This profile member is not however formed with a space for accommodation therein of the fan motor but a profile member of the type illustrated in FIG. 3 could be used, when the fan is in the form of a block, wherein the fan motor is positioned interiorly of the impeller. A block of this kind is illustrated schematically in FIGS. 7-9. In this case, there is no need for the supporting bridge member 28, since in accordance with the embodiment illustrated, the block is provided with an annular element 33 surrounding the impeller and completely bridging the internal cross-sectional area of the housing 16.

Figure 4:
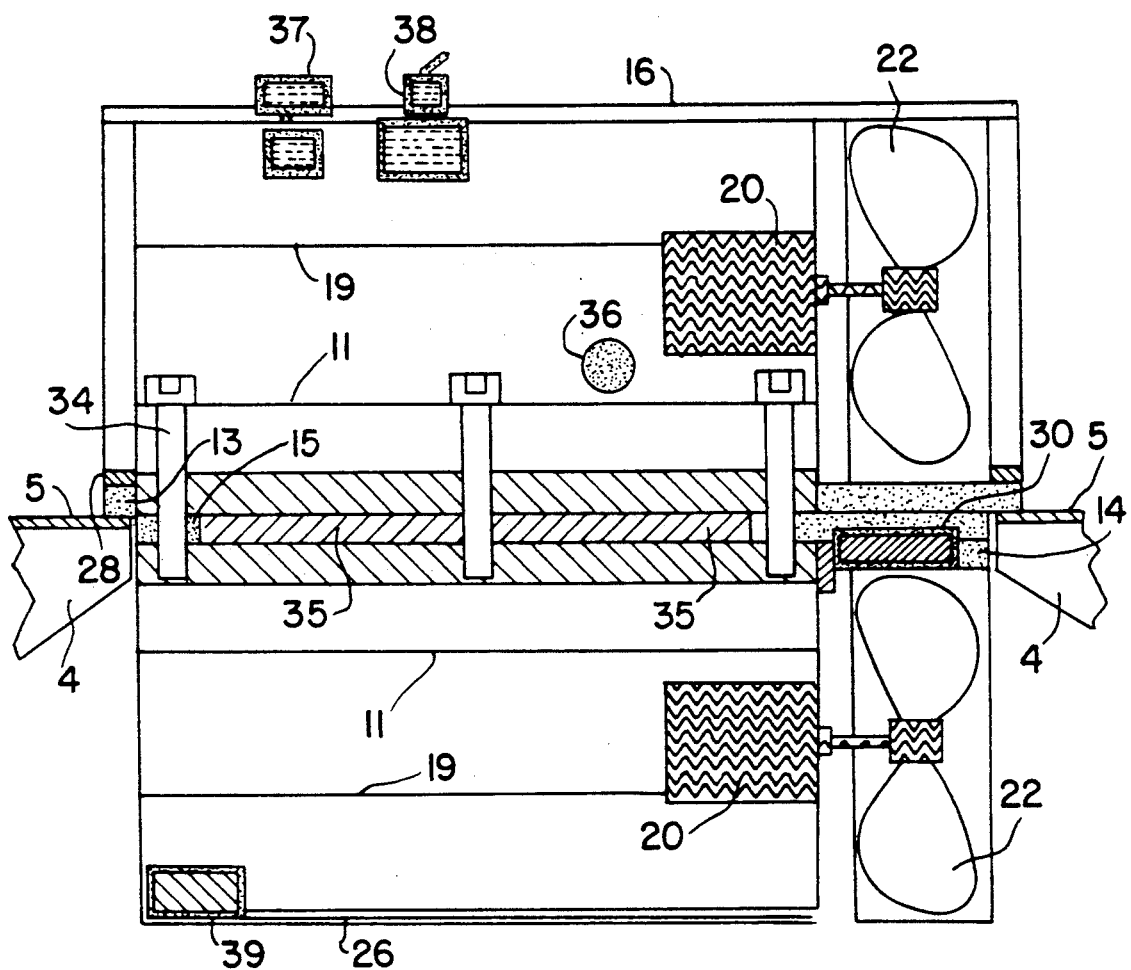
FIG. 4 is a schematical sectional view trough a device in accordance with the invention when mounted and also showing various control and regulating equipment means.
Figure 5:
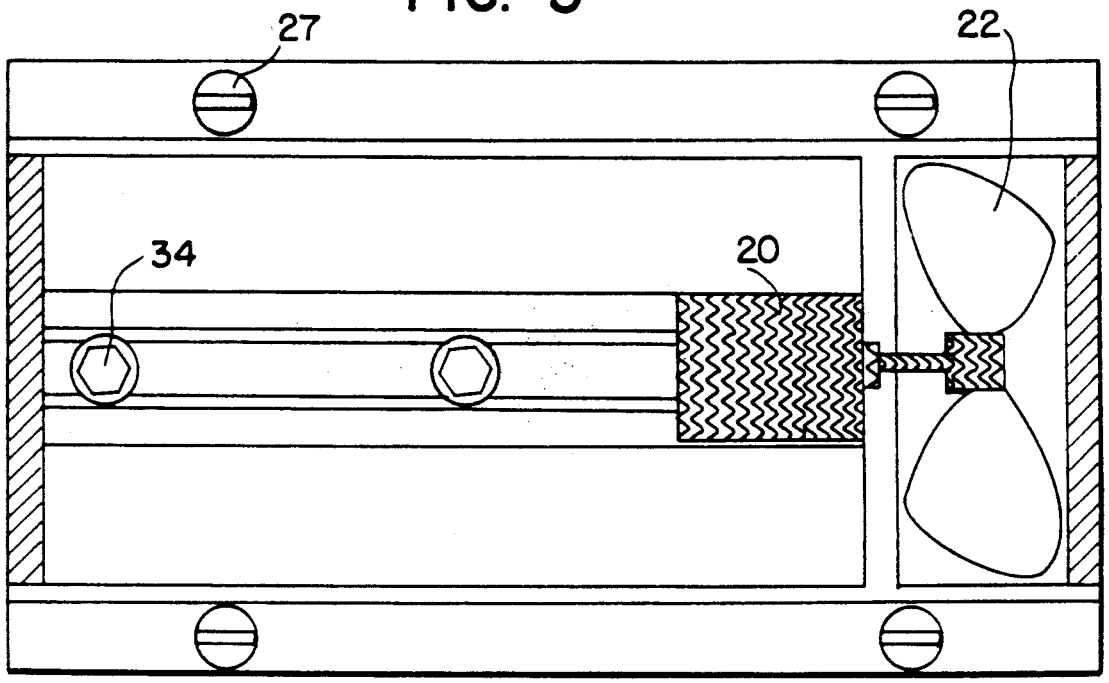
FIG. 5 is a view at right angles to the view of FIG. 4, also shown schematically and in a cross-sectional view.

FIGS. 4 and 5 illustrates schematically a central sectional view along the line IV—IV of FIG. 1. The sectional view also illustrates the bolts 34 interconnecting the tube profile members. Instead of arranging the bolts as screwed into one of the profile members the bolts may of course be through-bolts in which case a nut is positioned in abutment against the shoulder 11 of the lower profile member as illustrated i FIG. 4. The control electronics means which in FIG. 1 has been designated by reference numeral 30 could, as mentioned in the aforegoing, comprise a temperature indicating means. However, it may in some situations be convenient to separate the control electronics from the indicating means. In this case the indicating means may be positioned in the manner indicated in FIG. 4 by reference numeral 36, that is to say, inside the groove 9 whereas the rest of the control electronics could remain in the positions indicated previously. However, it obviously is within the scope of the invention to position the control electronics somewhere else, for instance on the external face on the apparatus.

Numeral reference 37 designates a regulating device, which could be for instance a temperature setting control means, and by reference numeral 38 is designated a switch, the function of which will be described further on. Other contact means required for the function of the device could for instance be positioned as indicated by reference numeral 39, that is to say inside the groove 9, interiorly of the covering strip 26 positioned inside the profile member located in space 3. In accordance with the example illustrated the thermoelectric blocks 35 are two in number but it is within the scope of the invention to use a larger or smaller number of blocks. When several blocks are used it is possible to vary the capacity of the cooling system in a very simple way by means of connecting said blocks in series or in parallel according to need, whereby the voltage across each block and thus its cooling effect will be changed. The components in FIGS. 4 and 5 that are equivalent those in FIGS. 1 and 2 have been given the same reference numerals.

Figure 6:
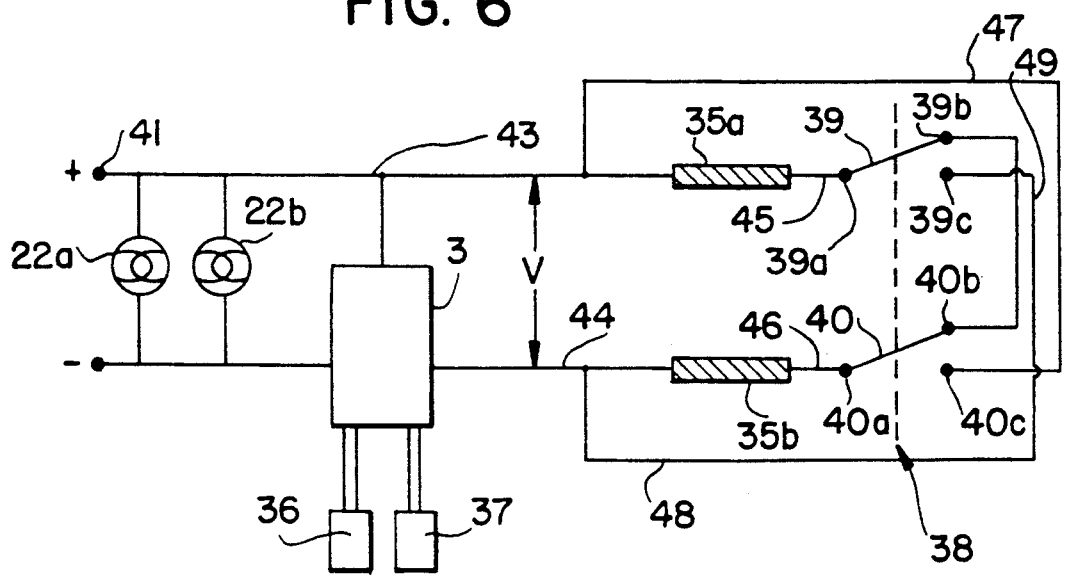
FIG. 6 is a coupling diagram relating to the device in accordance with the previous drawing figures.

FIG. 6 shows one example of the connection system of the device which in accordance with the previous drawing figures is provided with two thermoelectrical blocks. Like in accordance with the figures described in the aforegoing the two fans, each positioned inside its profile member, is designated by reference numerals 22a and 22b, respectively. The thermoelectric blocks are designated by 35a and 35b, the electronic control means is designated by 30, the sensor by 36, the temperature control means by 37 and the switch 38, illustrated in FIG. 4, also appears in the connection diagram.

In accordance with the embodiment shown the switch comprises two contact means 39, 40, which are arranged to move in parallel in such a manner that they can be shifted from a position in which connection is established between contact points 39a and 40a, respectively, and contact points 39b and 40b, respectively, to a position wherein 40a, respectively and contact points 39c and 40c, respectively. An intermediate position preferably also may exist in which there is no connection. The two points 41 and 42, are the points of connection of the system with the poles of a source of D.C. current. Between the point of contact 41 and the thermoelectric block 35a extends a conductor 43, and between the point of contact 42 and the thermoelectric block 35b extends a second conductor 44. Additionally, the thermoelectric block 35a is connected to the point of contact 39a by means of a conductor 45 and the thermoelectric block 35b is connected to the point of contact 40a via a conductor 46. Between the conductor 43 and the point of contact 40c extends a conductor 47, and between the conductor 44 and the point of contact 39c extends a conductor 48. In addition, between the point of contact 39b and the point of contact 40b extends a conductor 49.

Both fans 22a and 22b are connected in parallel in the circuit but if it is desired to vary the RPM of these components they could obviously be connected by means of stepwise or continuously variable resistances. It is likewise possible, should it so be desired, to shift them between connection in series and in parallel in order to thus vary the RPM and thus the speed of throughflow of the air. The electronics control could preferably be arranged to affect the circuitry in dependency of the signals received from the sensor 36. Thus, they may comprise a switch which interrupts the current through the circuit at one temperature level and closes the circuit in another. The temperature selector 37 could for instance be arranged to alter the circuit opening or closing positions.

In the illustrated position of the switch 38 both thermoelectric blocks 35a and 35b are connected in series, which means that half of the voltage V is applied over each one of them, with the result that the output heating effect and thus the energy consumption is reduced (this position may be used as a so called "economy position" when the desired temperature level is reached inside the space 3.) In the second position of the switch, that is when contacts 39a and 39c and 40a and 40c, respectively, are interconnected, the two thermoelectric blocks 35a and 35b are connected in parallel, which means that the entire voltage is applied on each one of the blocks, with the result that they give off the maximum effect. The intermediate position of the switch 38, if available, may be used as a close-off position, since in this position the circuit through the thermoelectric blocks is interrupted. In addition to this possibility of shifting between a position of connection in series or in parallel, the voltage across the thermoelectric elements may of course also be varied with the aid of series resistance or similar means without departing from the fundamental idea of the invention. However, it is advantageous to avoid the use of such resistances since these involve an increase of the energy consumption.

The device as described in the aforegoing means that two identical tunnels are mounted on each side of the wall that separates the media between which the heat exchange is to take place. However, the tunnel-shaped element in accordance with the invention could also be used unilaterally. In this case, a tunnel element of the kind shown for instance in FIGS. 7 and 8 and which is provided with one or several thermoelectric elements 35 is placed in such a manner that the thermoelectric element(s) is (are) in direct contact with the object to be cooled or heated. This could be the case for instance when it is desired to cool discrete chips and similar means. Naturally, the device in accordance with the invention may be used also for heat exchanging purposes between air and a liquid. In this case, it is suitable, as appears from 11, to use a block 49 having water channels 50 formed therein which by means of a planar face 51 is pressed against the thermoelectric block and which otherwise is insulated from the profile member contained inside the housing 16 by means of an insulating plate 13 or similar means enclosing the thermoelectric block.

Thus, the invention is limited to the double-tunnel mounting on two sides but could be used also unilaterally when an object of any kind should be cooled or heated.

The invention is not limited to the examples described in the aforegoing but could be varied as to its details within the scope of the appended claims without departing from the basic idea of the invention.

For instance, in order to adapt the device to the desired cooling/heating capacity the length of the profile member 7 and the housing 16 may be varied in order to allow the desired number of thermoelectric blocks to be placed one after the other in a row alongside the profile member. The invention provides a construction which has only a minimum of surfaces projecting beyond the thermoelectric blocks through which occur heat losses from one space to the other. In addition, the device is very compact in relation to the cooling/heating effect that it provides.

I claim:

1. A device in thermoelectric heaters/coolers, comprising at least one thermoelectric block of the Peltier type having planar heat transfer surfaces and heat exchanging means consisting of metallic convector elements, a current of forced air provided by a fan sweeping over said heat exchanging means, at least on one side of the block, characterized in that said convector element is formed by a plurality of squarely cut, extruded profile members having planar faces extending longitudinally alongside the thermoelectric blocks, said profile members being provided with fins and channels, said fan being an axial fan having an impeller spanning the major portion of the convector element cross-sectional area, said profile members being encompassed by a longitudinal wall structure defining an elongated channel for rectilinearly conducting air flow from said fan through said fins, said convector element being provided with means to retain the fan unit in position, and oppositely directed planar faces of the heat conducting material of the thermoelectric block being positioned to have an extensive heat-transfer contact with the corresponding longitudinal planar faces of the associated convector profile member, said planar faces of said thermoelectric block and said convector profile members planar faces extending in mutual parallel mating relationship, and said profile members being encompassed by a longitudinal wall structure defining an elongated channel means for rectilinearly conducting air flow from said fan through said fins parallel to the profile member planar faces.

2. A device as claimed in claim 1, characterized n that a thermally insulating material surrounding the thermoelectric block bridges the distance between the opposing planar faces of the convector profile members on either side of the thermoelectric block, said faces having an extension exceeding that of the thermoelectric block.

3. A device as claimed in claim 1, characterized in that the profile member forming the convector element is housed in a space forming a tunnel in which, in addition to the convector element, is accommodated also said fan unit.

4. A device as claimed in claim 1, characterized in that the profile member forming said convector element is formed with at least one longitudinal channel containing control units.

5. A device as claimed in claim 4, characterized in that the fan has a motor body which projects axially from the impeller and which is supported in and retained by said channel.

6. A device as claimed in claim 1, characterized in that the fan is formed as a module having a cross-sectional extension equalling the corresponding extension of the profile member forming said convector element.

7. A device as claimed in claim 4, characterized in that the fan module as well as the convector profile member have a cross-sectional extension equalling the internal cross-sectional extension of the tunnel.

8. A device as claimed in claim 1, characterized in that the convector profile member is formed with lengthwise grooves in which control equipment can be attached by means of screws and be mounted in abutment against ends of the profile member.

9. A device as claimed in claim 1, characterized in that the profile member is accommodated in a housing having an internal square cross-sectional shape essentially agreeing with the external cross-sectional shape of the convector profile member, whereby inside the internal space of the housing a number of mutually discrete, lengthwise channels are formed.

10. A device as claimed in claim 1, characterized in that two or several thermoelectric blocks are arranged in a row in spaced relationship alongside said convector profile member, the gaps between said blocks being filled with a thermally insulating material.

11. A device as claimed in claim 2, characterized in that the profile member forming the convector element is housed in a space forming a tunnel in which, in addition to the convector element, is accommodated also said fan unit.

12. A device as claimed in claim 2, characterized in that the profile member forming said convector element is formed with at least one longitudinal channel containing control units.

13. A device as claimed in claim 3, characterized in that the profile member forming said convector element is formed with at least one longitudinal channel containing control units.

14. A device as claimed in claim 2, characterized in that the fan is formed as a module having a cross-sectional extension equalling the corresponding extension of the profile member forming said convector element.

15. A device as claimed in claim 3 characterized in that the fan is formed as a module having a cross-sectional extension equalling the corresponding extension of the profile member forming said convector element.

16. A device as claimed in claim 6, characterized in that the fan module as well as the convector profile member have a cross-sectional extension equalling the internal cross-sectional extension of the tunnel.

17. A device as claimed in claim 2, characterized in that the convector profile member is formed with lengthwise grooves in which equipment can be attached by means of screws and be mounted in abutment against the ends of the profile member.

18. A device as claimed in claim 3, characterized in that the convector profile member is formed with lengthwise grooves in which equipment can be attached by means of screws and be mounted in abutment against the ends of the profile member.

19. A device as claimed in claim 4, characterized in that the convector profile member is formed with lengthwise grooves in which equipment can be attached by means of screws and be mounted in abutment against the ends of the profile member.

20. A device as claimed in claim 5, characterized in that the convector profile member is formed with lengthwise grooves in which equipment can be attached by means of screws and be mounted in abutment against the ends of the profile member.

* * * * *